US 6,556,429 B1

(12) United States Patent
Lien

(10) Patent No.: US 6,556,429 B1
(45) Date of Patent: Apr. 29, 2003

(54) HOUSING STRUCTURE FOR A NETWORKING DEVICE

(75) Inventor: Tai-Tung Lien, Miaoli (TW)

(73) Assignee: Accton Technology Corporation, HsinChu (TW)

( * ) Notice: Subject to any disclaimer, the term of this patent is extended or adjusted under 35 U.S.C. 154(b) by 178 days.

(21) Appl. No.: 09/698,094

(22) Filed: Oct. 30, 2000

(51) Int. Cl.$^7$ ................................. G11B 5/012
(52) U.S. Cl. ..................... 361/679; 174/16.1; 165/80.3; 312/223.1
(58) Field of Search .......................... 361/679, 687–690; 174/16.1, 16.3; 165/80.3, 104.33, 185; 312/223.1–223.6; 360/96.5, 97.01

(56) References Cited

U.S. PATENT DOCUMENTS 5,808,830 A * 9/1998 Stefanksy et al. ....... 360/97.01
5,949,611 A * 9/1999 Stephens et al. ........... 360/96.5
6,226,143 B1 * 5/2001 Stefanksy et al. ....... 360/97.01

* cited by examiner

Primary Examiner—Darren Schuberg
Assistant Examiner—Hung Van Duong
(74) Attorney, Agent, or Firm—Birch, Stewart, Kolasch & Birch, LLP

(57) ABSTRACT

An improved housing structure for a networking device is provided to make the assembly of the housing more efficiently. The improved housing structure includes a metal base having a plurality of L-shaped slots formed on the edges between the bottom plane and the sidewalls of the metal base. Close to each of the L-shaped slots, a beveled region is formed on the side edge of the sidewall. A fitting plastic cover has a plurality of guard tenons integrally formed on at least two inner sidewalls thereof and corresponding to the positions of the L-shaped slots. Each pair of the L-shaped slots and the guard tenons together forms a mortise and tenon mounting structure. Accordingly, the housing of the networking device can be conveniently assembled without screws and nuts.

6 Claims, 4 Drawing Sheets

HOUSING STRUCTURE FOR A NETWORKING DEVICE

BACKGROUND OF THE INVENTION

A. Field of the Invention

The present invention relates to an improved housing structure for a networking device, and more particularly to improvements in a networking hub/switch housing having a mortise and tenon mounting structure.

B. Description of the Related Arts

Conventional networking device housings are made of metal. The metal housing has the advantages of durability, and solidity. However, the metal housing is higher in manufacturing cost and inconvenient to assemble. The assembly of the metal housing usually requires conventional screws and nuts.

To reduce the manufacturing cost and improve the outlook of a networking device, a housing with a metal base and a fitting plastic cover is mostly adopted by networking device manufacturers. The plastic cover is cheaper in cost and easily adaptable to a variety of designs by molding. Since the metal base and the plastic cover are made of different materials with different properties, they cannot be locked together using conventional technology of screws and nuts. It is desirable to provide a housing structure, which can prevent the scratches formed on the surface of the metal base and the breakage of the plastic cover while assembling the housing.

SUMMARY OF THE INVENTION

It is a primary object of the present invention to provide an improved housing structure of a networking device for the convenience of assembly.

In accordance with the present invention, an improved housing structure for a networking device is provided to make the assembly of the housing more efficiently. The improved housing structure includes a metal base having a plurality of L-shaped slots formed on the edges between the bottom plane and the side planes. Close to each of the L-shaped slots, a beveled region is formed on the side edge of the metal base. A fitting plastic cover has a plurality of guard tenons integrally formed on at least two inner sidewalls thereof and corresponding to the positions of the L-shaped slots. Each pair of the L-shaped slots and the guard tenons together forms a mortise and tenon mounting structure. Accordingly, the housing of the networking device can be conveniently assembled without screws and nuts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects and advantages of the present invention will become apparent when considered in view of the following description and accompanying drawings wherein.

DETAILED DESCRIPTION OF THE INVENTION

Figure 1A:
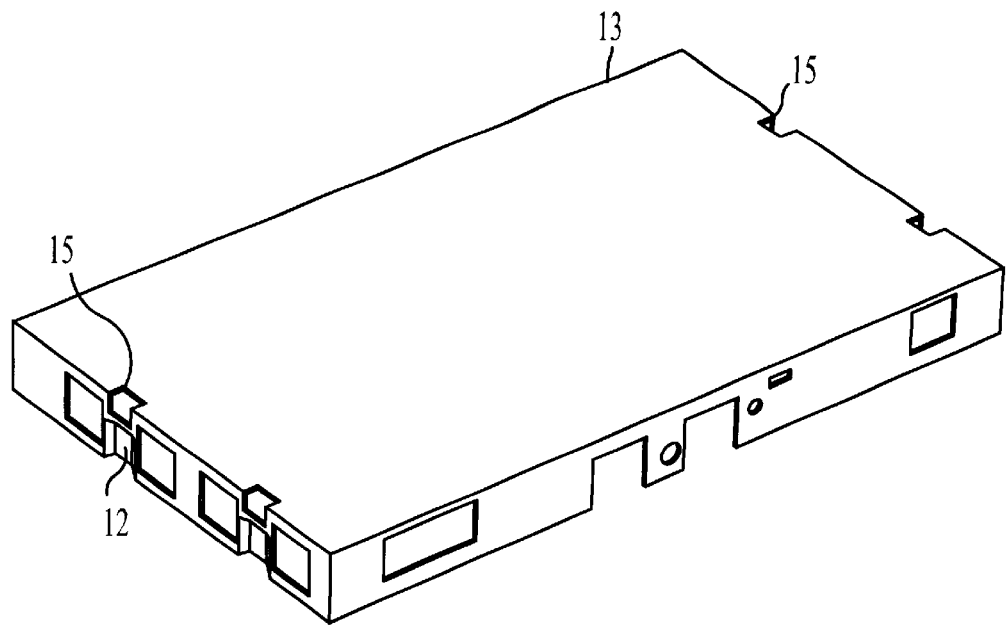
FIG. 1A is a top view showing the base of the network device housing according to the preferred embodiment of the present invention.
Figure 1B:
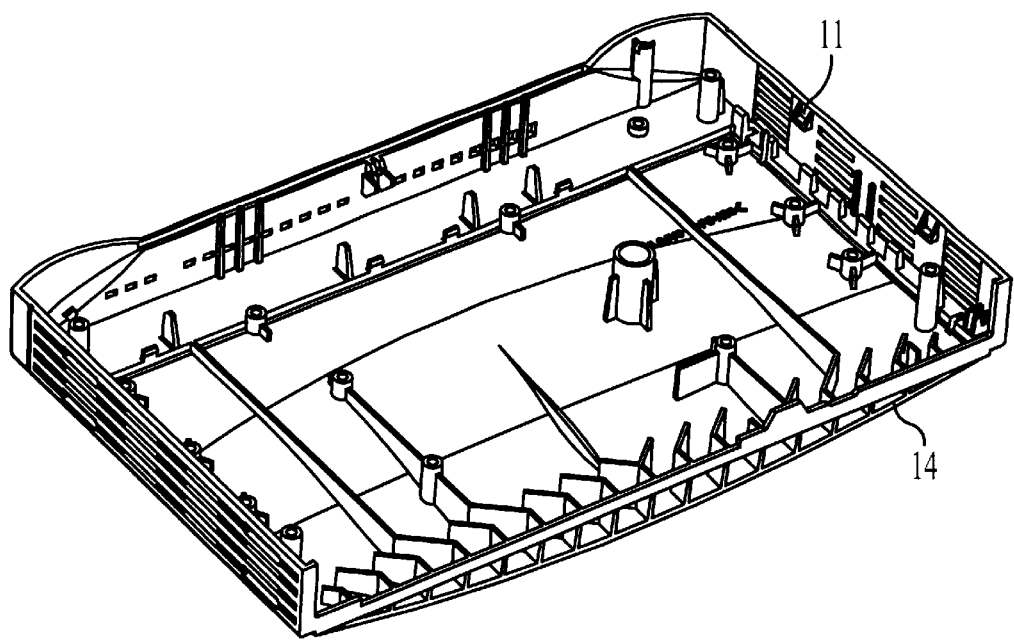
FIG. 1B is a perspective view showing the inner structure of the plastic cover of the network device housing according to the preferred embodiment of the present invention.
Figure 1C:
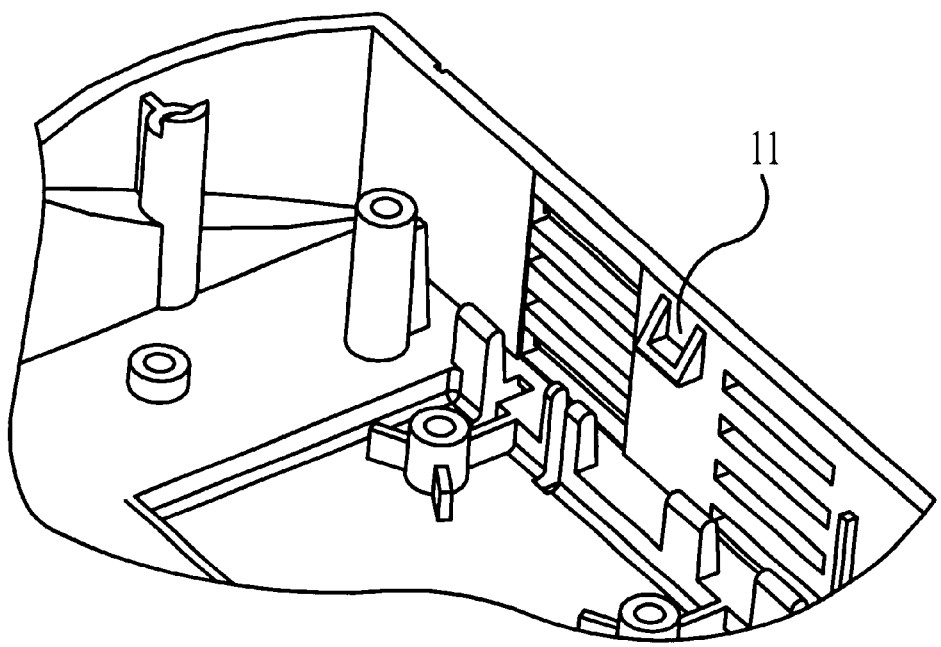
FIGS. 1C and 1D are enlarged views showing the structure of the mortise and tenon mountings according to the preferred embodiment of the present invention.
Figure 1D:
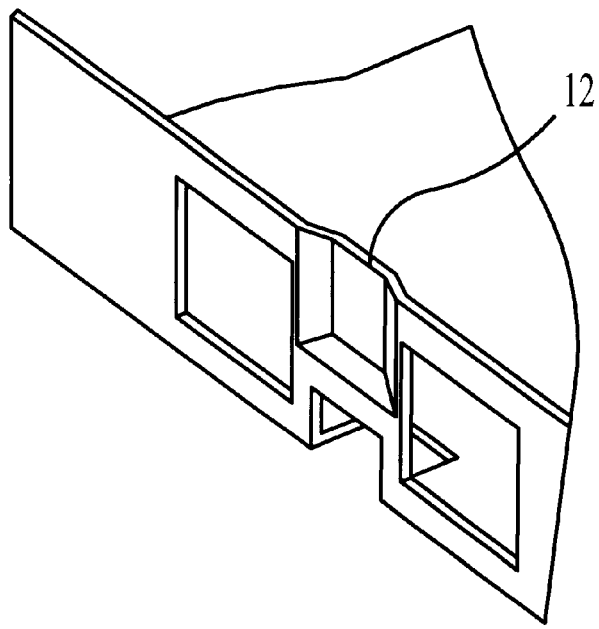

According to the preferred embodiment of the present invention, the housing of the networking device includes a metal base 13 and a fitting plastic cover 11. The plastic cover 11 can be easily molded into various styles in response to various applications. The metal base 13, on the other hand, has the advantage of durability and solidity.

The improved housing structure of the invention are illustrated in FIGS. 1A~1D. The metal base 13 is formed by a bottom plane and four sidewalls. The sidewalls of the metal base 13 contain multiple openings for connecting to networking ports and showing indicating lights. On the edges between the bottom plane and the sidewalls of the metal base 15, at least two L-shaped slots 15 are formed for forming a mortise structure in connection to the guard tenons 11 of the plastic cover 11. Close to each of the L-shaped slots 15 and the edges of the sidewalls, a beveled region 12 is formed for guiding the guard tenons 11 into an associated L-shaped slot 15. The structure of the L-shaped slot 15 integral with the metal base 13 defines a mortise. The structure of the guard tenon 11 integral with the plastic cover 14 defines a tenon. Each pair of the L-shaped slot 15 and associated guard tenon 11 forms a mortise and tenon mounting structure.

The guard tenon 11 is of a right triangle shape. The slope of the guard tenon 11 is facing to the bottom plane of the housing. The slop of the guard tenon 11 and the slanting wall of the bevel region 12 create a sliding contact 16 for the guard tenon 11 to slide into the L-shaped slot 15. When assembling the housing, the plastic cover 14 is pushed downwards to fit the metal base 13. The guard tenons 11 gradually slide along the recess portion of the beveled region 12. When the protrusion portions of the guard tenons 11 move to the sliding contacts 16 between the beveled regions 15 and the L-shaped slots 15, the plastic cover 14 is pushed to deform slightly outwards. With a little force, the guard tenons 11 can be easily guided into the L-shaped slots 15. After the guard tenons 11 are pushed into the associated L-shaped slots 15, the flat portions of the guard tenons 11 closely contact against the L-shaped slots 15 to prevent the guard tenons 11 from slipping away from the L-shaped slots 15.

Figure 2A:
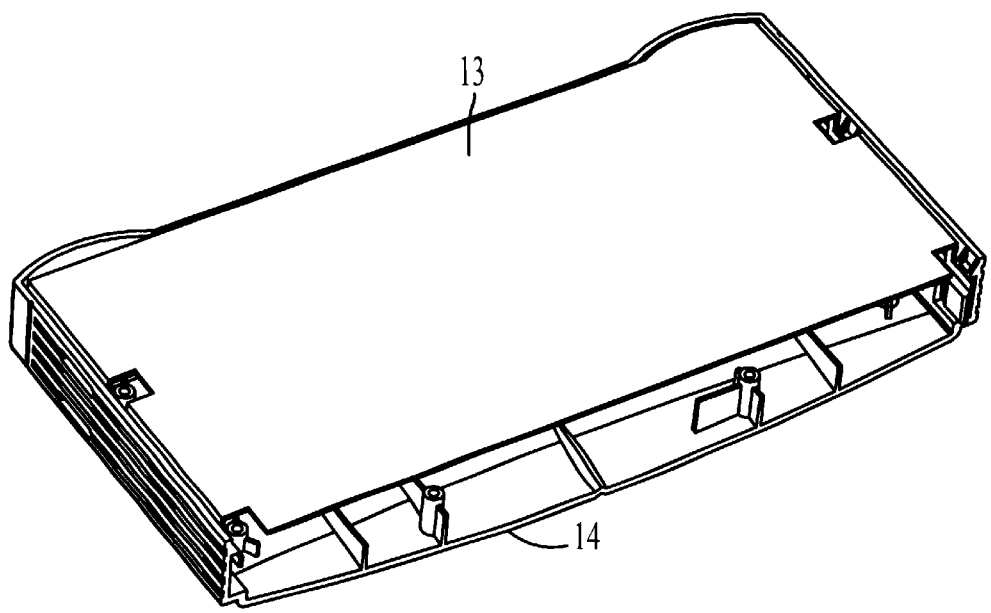
FIG. 2A is a partial cut away bottom view showing the networking device after the plastic cover and the base are locked together.
Figure 2B:
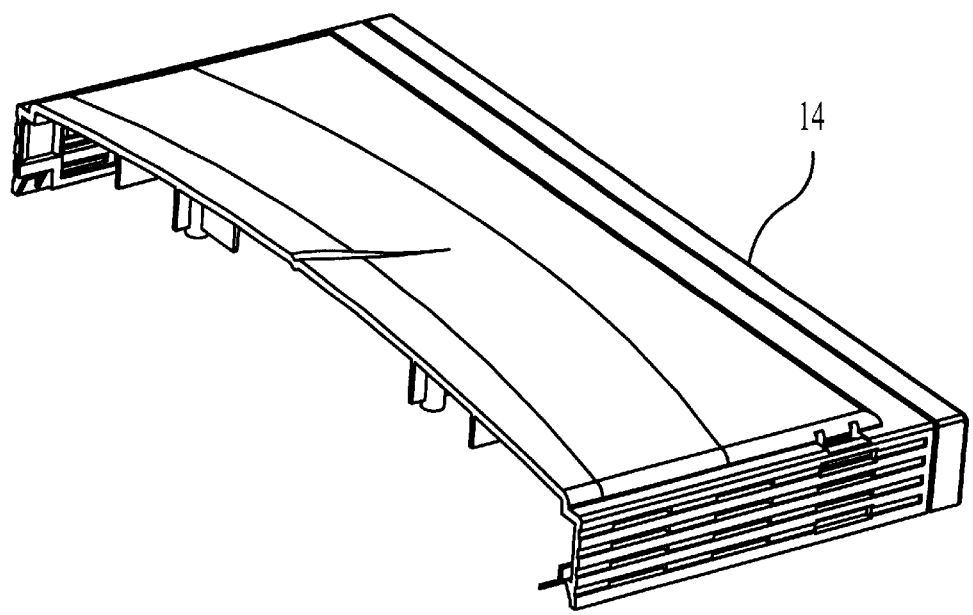
FIG. 2B is a partial cut away top view showing the networking device after the plastic cover and the base are locked together.
Figure 2C:
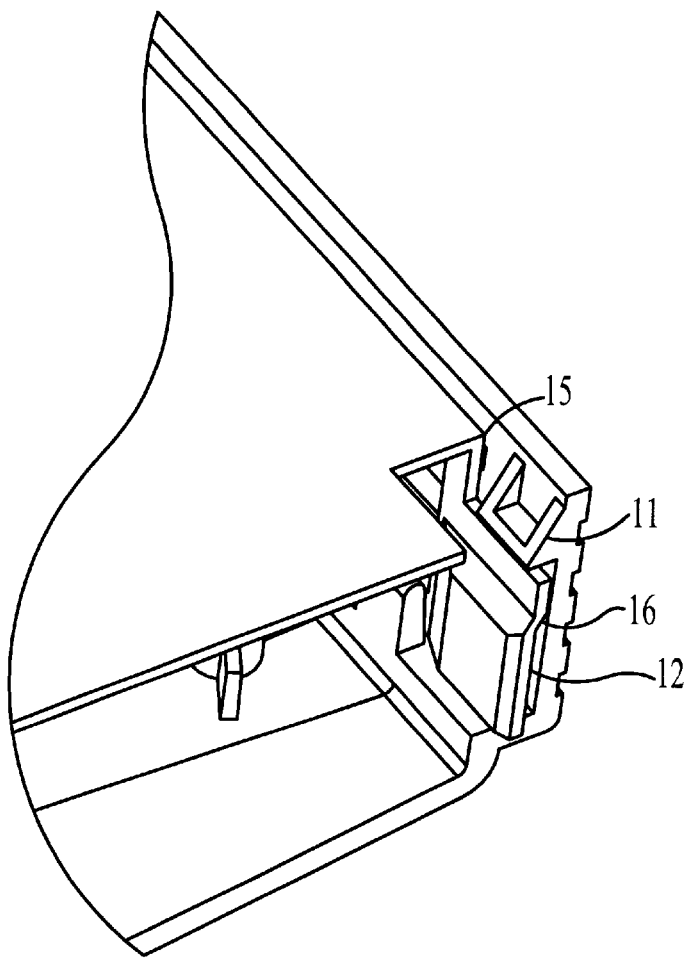
FIGS. 2C and 2D are enlarged views showing the structure of the mortise and tenon mounting according to the preferred embodiment of the present invention.
Figure 2D:
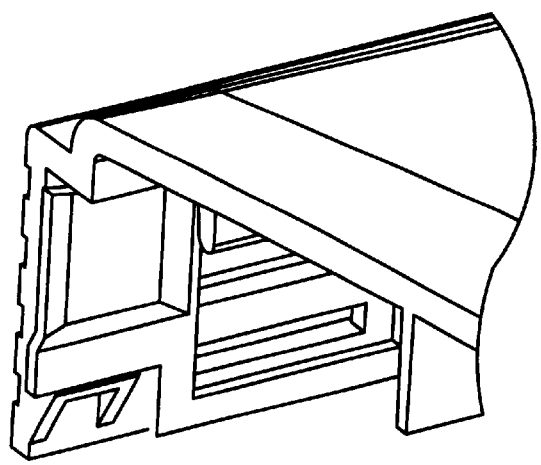

The resultant structure of the metal base 13 and the plastic cover 14 after assembly is shown in FIGS. 2A~2B. The enlarged views of the mortise and tenon mounting structure can be clearly seen from FIGS. 2C and 2D. As shown in FIG. 2C, the guard tenon 11 fits into the L-shaped slot 15. The beveled region 12 has a recess portion slanting inwards. The sliding contact 16 between the beveled region 12 and the guard tenon 11 allows the guard tenon 11 to slide into the L-shaped slot 12 more easily. FIG. 2D shows the mortise and tenon mounting structure when turned the other around.

Accordingly, the resilient deformation of the plastic cover 24 allows the guard tenons 11 to be more smoothly guided into the L-shaped slots 15 without forming scratches on the surface of the metal base 13 or cause breakages of the plastic housing 11.

It should be understood that various alternatives to the structures described herein may be employed in practicing the present invention. It is intended that the following claims define the invention and that the structure within the scope of these claims and their equivalents be covered thereby.

What is claimed is:

1. A housing structure for a networking device comprising:
    a plastic cover having a plurality of guard tenons integrally formed on and protruding from at least two inner sidewalls of the plastic cover; and
    a metal base having a bottom plane and a plurality of sidewalls each having a first and second edge, the first edge of the sidewalls being at a junction of the sidewall with the bottom plane and the second edge being opposed to the first edge, a plurality of slots formed on the first edges and corresponding to positions of said plurality of guard tenons, and a plurality of beveled regions integrally formed on the second edges of said sidewalls and being close to said plurality of slots for guiding said plurality of guard tenons into said plurality of slots.

2. The housing structure as claimed in claim 1, wherein said plurality of beveled regions have recess portions formed slightly inwards.

3. The housing structure as claimed in claim 1, wherein each pair of said plurality of guard tenons and said plurality of beveled regions forms a mortise and tenon mounting structure.

4. The housing structure as claimed in claim 1, wherein the beveled regions form a plurality of recesses for receiving and guiding the tenons, the beveled regions being aligned with the slots.

5. The housing structure as claimed in claim 1, wherein the slots extend from the sidewall of the metal base onto the bottom plane of the metal base such that the slots generally have an L-shape.

6. The housing structure as claimed in claim 4, wherein each of the beveled regions has a sloping wall adjacent the aligned slot, the sloping wall camming the tenon to engage in the slot during assembly of the housing structure.

* * * * *